United States Patent

Avins et al.

[15] 3,697,885

[45] Oct. 10, 1972

[54] AUTOMATIC FREQUENCY CONTROL CIRCUITS

[72] Inventors: Jack Avins, Princeton; Jack Craft, Somerville, both of N.J.

[73] Assignee: RCA Corporation

[22] Filed: Dec. 4, 1970

[21] Appl. No.: 95,082

[52] U.S. Cl. ....................331/8, 325/422, 331/36 C, 331/177 V, 334/15

[51] Int. Cl. ..........................................H03b 3/04

[58] Field of Search..........331/36 C, 177 V; 334/15; 332/30 V; 325/422

[56] References Cited

UNITED STATES PATENTS 3,440,544 4/1969 Pampel......................331/36

3,544,903 12/1970 Sakamoto...................334/15

FOREIGN PATENTS OR APPLICATIONS 979,653 1/1965 Great Britain...............334/15

1,234,278 2/1967 Germany....................334/15

*Primary Examiner*—John Kominski

*Attorney*—Eugene M. Whitacre

[57] ABSTRACT

A circuit used in an automatic frequency control (AFC) scheme employs a voltage divider having a variable arm coupled to a varactor diode to vary the reactance of the diode to enable tuning of a receiver. An AFC error signal is converted into a current and injected into the divider to equalize the loop gain of the AFC system over the tuning range of the receiver.

7 Claims, 2 Drawing Figures

PATENTED OCT 10 1972 3,697,885

INVENTORS,
JACK AVINS &
JACK CRAFT
BY Arthur L. Placy
Attorney

AUTOMATIC FREQUENCY CONTROL CIRCUITS

This invention relates to automatic frequency control and, more particularly, to a circuit which provides an improved control signal to a variable reactance device.

Most conventional receivers (AM, FM and TV) employ tuners to respond to received radio frequency (RF) signals. Such tuners include selective amplifiers to produce an amplified version of the received signal. This amplified signal is conventionally applied to a mixer circuit which is also responsive to a local oscillator signal. The difference between the two signals provides an intermediate frequency or IF signal. Automatic frequency control (AFC) serves to control the frequency of the local oscillator to assure that the mixer provides the optimum IF signal.

There are a number of techniques used to produce the AFC control voltage. This voltage is normally applied to a variable reactance circuit associated with the oscillator to change or alter its frequency accordingly. Certain of these systems utilize varactor diodes which possess a capacitance which varies according to the magnitude of an applied control voltage. In such systems the receiver is tuned to a desired channel by means of a manual tuning control, and when using varactor diodes, the tuning control serves to vary the bias on these diodes. Accordingly, the varactor diodes may be subjected to a first DC voltage which is varied by means of the tuning control. The varactors additionally may also receive a second DC voltage which is produced by a discriminator circuit used in an automatic frequency control system. Where the varactor diode is subjected to both a tuning control voltage and an AFC voltage, a problem arises in that the control or gain characteristics of the AFC loop vary over the entire tuning range of the apparatus.

The AFC loop gain is a dimensionless quantity and can be defined for a feedback control system. In such a system the discriminator exhibits a volts per KHz output sensitivity, and the local oscillator exhibits a KHz per volt output sensitivity. The product of the two sensitivities yields the value of the dimensionless AFC loop gain. Accordingly, it is desired that a given discriminator voltage increment vary the frequency of the oscillator the same amount relatively independent of the center frequency of the oscillator.

A variation in the loop gain affects the response of the receiver depending upon the station tuned to. It is therefore desirable to produce a signal for such a varactor diode which will permit tuning the receiver over the desired range while maintaining the AFC loop gain uniform. This assures that the oscillator will change frequency a given amount upon the application to the variable reactance device of a given increment of control voltage.

According to an embodiment of the present invention, a circuit for accurately varying the frequency of an oscillator, by controlling the reactance of the variable reactance device coupled to the frequency determining network of the oscillator, includes a voltage divider having a variable arm coupled to the variable reactance device and operative to change the voltage applied to the device to therefore vary the frequency of the oscillator. Detector means are responsive to the oscillator's frequency to produce an error signal for frequencies different from a desired predetermined value. First means are coupled to the detector means and responsive to the error signal to provide a current directly proportional thereto, and second means are provided for coupling the first means to the voltage divider for injecting a portion of the current into the divider to proportion the voltage provided by the divider due to the error signal. This action serves to vary the frequency of the oscillator relatively independent of the setting of the variable arm. This arrangement by serving to effectively inject current into the divider, operates to equalize the AFC loop gain across the frequency band of the receiver.

A complete description of the invention will be given if reference is made to the following figures, in which.

Figure 1:
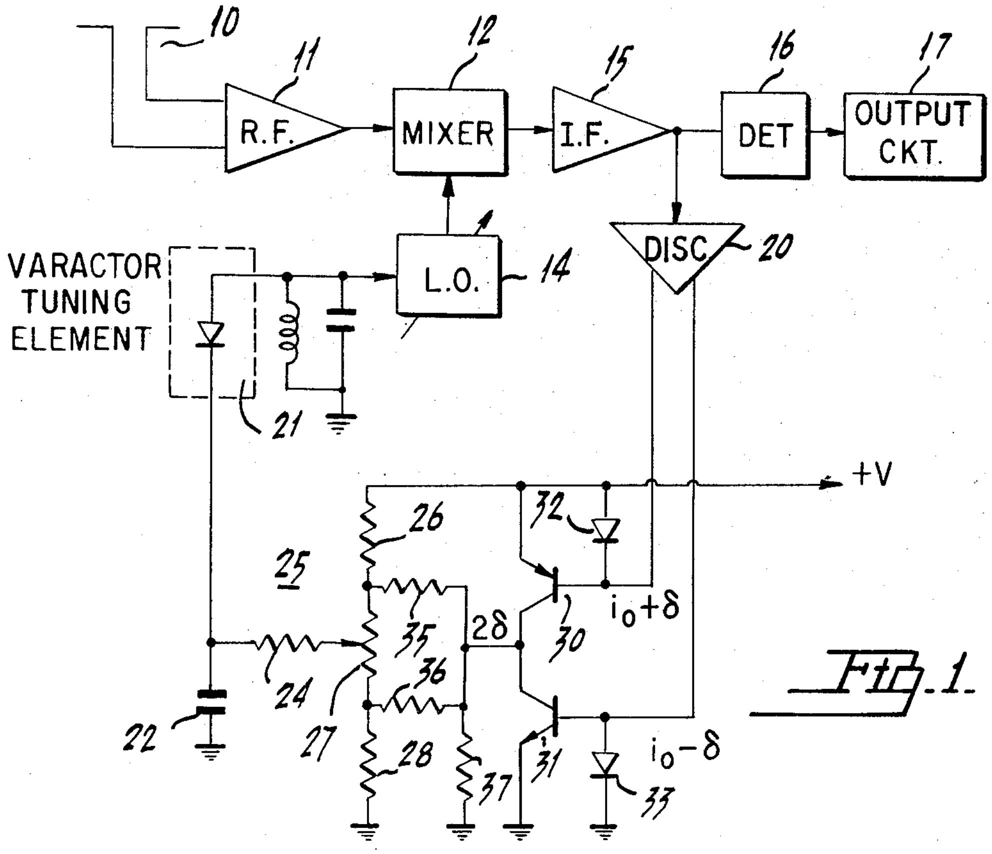
FIG. 1 is a schematic diagram partly in block form of a receiver employing a control circuit according to this invention.

Referring to FIG. 1, there is shown an antenna 10 capable of responding to a band of transmitted radio frequency (RF) carrier signals. The terminals of antenna 10 are coupled to the input terminals of a radio frequency or RF amplifier 11. The output of the RF amplifier 11 is conventionally applied to one input of a mixer circuit 12. The mixer circuit 12 has another input to which is applied a signal developed by a local oscillator circuit 14 included in such a receiver. The output of the mixer 12 provides sum and difference frequencies in accordance with the local oscillator and RF frequencies. A suitable one of these frequencies is selected by a relatively narrow band IF amplifier circuit 15. Conventionally, the output of the IF amplifier circuit 15 is coupled to an input of a suitable detecting circuit 16 which operates to demodulate and retrieve the information transmitted on the incoming carrier signal. The output of the detector 16 is coupled to suitable output circuitry 17 which may, for example, be a kinescope display or, in the case of a radio receiver, an amplifier and speaker circuit.

As indicated, the IF signal is derived from the local oscillator and the RF signal. Therefore, changing the frequency of the local oscillator 14 permits one to tune the receiver over the entire band. This serves to select one of a number of different carriers being transmitted and responded to by the antenna 10. Once the desired station is selected, an automatic frequency control loop or AFC circuit maintains the frequency of the oscillator at the proper value to assure reception of the desired signal. The AFC loop includes a discriminator circuit 20 which has an input coupled to the output of the IF amplifier 15, and provides a DC control voltage according to the frequency of the IF. This DC control voltage is conventionally applied to a variable reactance circuit associated with the local oscillator 14 of the receiver. This action serves to alter the frequency of the oscillator in a direction to maintain the frequency of the IF relatively constant. Such a variable reactance device may be the varactor diode 21 which is coupled across a suitable resonant circuit included in the oscillator 14, as known in the art. The varactor tuning element 21 is also coupled to a voltage divider 25 via a resistor 24. The junction between the cathode of the varactor diode 21 and the resistor 24 is bypassed to ground through a suitable filtering capacitor 22 to provide a bypass for high frequency AC signals.

The voltage divider 25 includes three resistors 26, 27 and 28 coupled in series between a source of potential +V and a point of reference potential. Resistor 27 is a potentiometer having its variable arm connected to the other terminal of resistor 24. Accordingly, as the variable arm of resistor 27 is moved, a variable bias is applied to the varactor diode 21, thus varying its capacitance and therefore causing the oscillator to change frequency. For example, in a typical FM tuner the range of voltage required for tuning the local oscillator over the FM band (88–108) MHz can vary from about +2 volts to +9 volts. Basically, this voltage range is available by moving the variable arm of resistor 27 between the upper and lower limits. In most prior art circuits the AFC voltage derived from the discriminator 20 is applied via a separate path to the varactor diode 21 or to a separate varactor diode associated with the oscillator. This additional circuit provides the necessary change in frequency needed for AFC operation.

In the circuit shown the outputs of the discriminator are applied to the base electrodes of transistors 30 and 31 which are connected in series between the source of potential +V and the point of reference potential. Transistors 30 and 31 are of opposite conductivity. Essentially, the transistors 30 and 31 are connected in shunt with the aforementioned voltage divider 25. The emitter electrode of the PNP transistor 30 is connected to the +V supply. The collector electrode is coupled to the collector electrode of the NPN transistor 31 having its emitter electrode coupled to ground. The base electrode of PNP transistor 30 is connected to the positive output of discriminator 20 while the base electrode of NPN transistor 31 is connected to the negative output of discriminator 20. Each transistor has a forward biased diode 32 and 33 respectively connected between its base and emitter electrodes. The diodes serve to provide current translation with temperature compensation. The output of the transistor circuit is taken from the collector connection of the two transistors. This connection is coupled to the high potential terminal of the variable resistor 27 via a resistor 35, and to the low potential terminal of variable resistor 27 via a resistor 36. A resistor 37 has one terminal connected to the junction of resistor 36 and the collector connection, and the other terminal connected to the point of reference potential or ground.

The operation of the circuit shown in FIG. 1 is as follows. The output of discriminator 20 is push-pull. That is, the discriminator is of the type that provides two outputs, each 180° out of phase, for a given error signal. Therefore, output currents of the discriminator 20 for an error signal of $\delta$ are respectively $i_o + \delta$ and $i_o - \delta$. The term $i_o$ is equal to the quiescent DC level at the outputs of discriminator 20. For a zero error signal, the output current at the collectors of transistors 30 and 31 is zero, because of the equal and opposite current flow in the transistors. Transistor 30 being a PNP transistor causes a current to flow through its emitter-to-collector path and towards ground. The NPN transistor 31 causes a current to flow from the +V supply through resistors 26 and 35 and thence through the collector-to-emitter path. Since the diodes 32 and 33 match the respective transistors 30 and 31, the quiescent currents are determined purely by the input current at the respective base electrodes. Thus for the equal input current of $i_o$, the current at the common collector connection is zero. When the IF from amplifier 15 is off frequency, the discriminator 20 produces an error voltage which causes the above currents of $i_o + \delta$ and $i_o - \delta$ to be respectively applied to the base electrodes of transistors 30 and 31. As described above, the quiescent current $i_o$ is cancelled, while the contributions of the input current due to the error signal $\delta$ are added, thus producing an output equal to $2\delta$. The current $2\delta$ is therefore representative of the error signal produced by the AFC discriminator circuit 20. The output voltage divider 25 serves as a tuning control supply for the varactor diode 21. When the arm of potentiometer 27 is set at the junction between resistors 26 and 27, the varactor receives a high, positive back bias, which indicates a minimum capacitance and therefore a high frequency output from the oscillator 14. For this setting the correction voltage due to AFC as applied to the varactor 21 is developed mainly across resistor 26.

If the variable arm of potentiometer 27 is now moved to the junction between resistors 27 and 28, a low back bias is applied to the varactor, thus establishing a higher capacity and a lower oscillator frequency. In this condition the output voltage due to AFC is reduced by the divider action of resistors 26, 27 and 28. In general, this voltage reduction is such that the AFC loop gain falls off or decreases. To restore the loop gain, resistor 36 is added to effectively inject a portion of the control current into resistor 28. This current injection therefore develops a larger AFC voltage across resistor 28 for the above setting of resistor 27. This action serves to maintain the AFC control voltage at a value to afford uniform loop gain for the reduced frequency operation of the oscillator 14. The resistor 37 serves as a voltage divider with resistor 35 to prevent transistor 30 from saturating or operating with an undesirably low collector voltage.

In summation, the above-described circuit permits one to utilized the same varactor diode 21 for oscillator tuning as well as for AFC. This dual operation is provided while the circuit serves to equalize the AFC loop gain over the entire tuning range. Furthermore, the circuit operates from a single power supply +V which can be the same supply that energizes the local oscillator and other circuitry in the receiver. The signal translating stages, including transistors 30 and 31 and diodes 32 and 33, are easily implemented with monolithic silicon circuits. The diodes 32 and 33 on an integrated circuit assembly would be transistors having their collectors tied to their base electrodes. These transistor-connected diodes 32 and 33 would therefore perfectly match the associated transistors 30 and 31, thus assuring accurate operation of the current translating stages.

Figure 2:
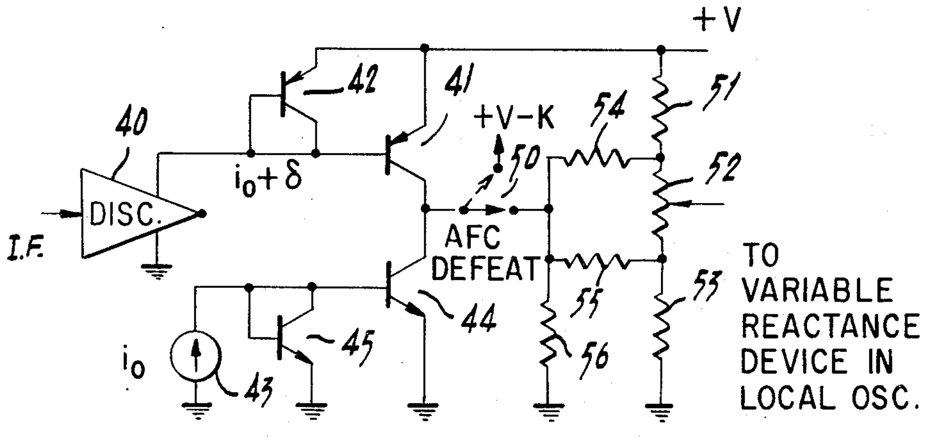
FIG. 2 shows a schematic diagram of an alternate embodiment of the control circuit.

Referring to FIG. 2, there is shown a single ended version of the control circuit as described in FIG. 1. A discriminator 40 has the IF signal applied to the input thereof. The output of the discriminator is single ended and provides a current equal to the quiescent current $i_o$ plus the error signal current $\delta$ developed by the discriminator when the IF frequency is off-center. This current is applied to the base electrode of a PNP lateral transistor 41. The base electrode of the PNP transistor 41 is also coupled to the +V supply via the diode-connected PNP transistor 42. The emitter electrode of transistor 41 is connected to the +V supply, while the collector electrode thereof is connected to the collector electrode of an NPN transistor 44 having its emitter electrode returned to ground. Connected to the base electrode of transistor 44 is a current source 43, whose magnitude is equal to the quiescent current $i_o$.

The base electrode of transistor 44 is returned to ground through the forward biased transistor connected diode 45. In this manner the quiescent current $i_o$ is cancelled as above. The circuit also provides at the collector connection an output current equal to δ. In this case the loop gain is reduced by the factor of one-half, but the requirements for a push-pull discriminator output are eliminated.

The remainder of the circuit is similar to that described in conjunction with FIG. 1. In the configuration the collector connection between transistors 41 and 44 is coupled through an AFC defeat switch 50 to a voltage divider including the series combination of resistors 51, 52 and 53. The divider is connected between the +V supply and a point of reference potential. Accordingly, the collector connection is coupled through switch 50 to the high voltage terminal of resistor 52 via resistor 54 and to the low voltage terminal of resistor 52 via resistor 55. The junction between resistor 55 and the AFC switch terminal is connected to ground through resistor 56. As indicated above, the voltage divider provides means for tuning the varactor diode or variable reactance device associated with the local oscillator over the entire tuning range. Resistors 54 and 55 serve to maintain the AFC loop gain constant and relatively independent of the frequency to which the receiver is tuned. As indicated, an AFC defeat switch 50 is shown having a control arm coupled to the collector connection of transistors 41 and 44. One switch terminal is connected to the junction of resistors 54 and 55. In this position the AFC control current δ is applied to the voltage divider to operate the varactor in accordance with the magnitude of this control voltage. The purpose of the AFC defeat switch 50 is to enable the consumer to select a station during a tuning process without having to counteract the effect of AFC. When the AFC switch 50 is placed in the dotted line position, the control current connection to the tuning potentiometer is broken and hence the control current δ is not applied to the varactor and tuning can be accomplished without AFC control. In the dashed line position the collector connection of transistors 41 and 44 is returned to a source of potential sufficiently less that +V, so as to provide adequate collector potential for transistors 41 and 44. In this manner the entire circuit shown remains relatively unaffected by the switching operation. That is, the voltage divider including resistors 51, 52 and 53 serves to tune the varactor diode over the same exact range as it did during AFC operation. Furthermore, since AFC switch 50 applies a bias to the transistor circuit during the AFC defeat operation, it prevents transistors 41 and 44 from introducing impedance variations which might affect the linearity of an audio discriminator or other circuitry operated in parallel with the AFC discriminator 40. The AFC defeat switch 50 shown in FIG. 2 would be applicable for inclusion in the circuit shown in FIG. 1 in the same exact position. It is this position which permits the circuitry described to operate with relatively the same quiescent currents and voltages when the switch 50 is placed in the dashed line position or defeat position corresponding to the removal of the AFC control voltage from the varactor diode. This switch operation therefore permits the consumer to properly tune the receiver; and further affords the advantage that when the receiver is properly tuned, this proper tuning is not affected by the position of AFC switch 50.

What is claimed is:

1. In an apparatus employing an oscillator whose frequency is varied to perform tuning of such apparatus over a range of frequencies, said apparatus including an IF amplifier for responding to an intermediate frequency signal produced by heterodyning a wave from said oscillator with a signal having a frequency in said range, and a discriminator circuit for producing an automatic frequency, control signal proportional to said intermediate frequency signal being different from a desired frequency, in combination therewith, apparatus for providing both tuning and automatic frequency control of said oscillator comprising:

a. a variable reactance device coupled to said oscillator and having a voltage responsive reactance which controls the frequency of said oscillator.

b. a voltage divider having an adjustable slider coupled to said variable reactance device to change the voltage applied thereto when said slider is adjusted.

c. first and second transistors of opposite conductivity types each having base, emitter and collector electrodes, said emitter electrode of said first transistor and said emitter electrode of said second transistor being connected to different potential points, d. a first diode connected between the base and emitter electrodes of said first transistor and poled for easy current conduction in the same direction as the base-to-emitter junction of said first transistor, e. a second diode connected between the base and emitter electrodes of said second transistor and poled for easy current conduction in the same direction as the base-to-emitter junction of said second transistor, f. means coupled between said base electrodes of said first and second transistors for applying said automatic frequency control signal thereto, g. means coupling said collectors to said voltage divider at spaced points on opposite sides of said slider selected to provide substantially constant gain fro the loop circuit including said discriminator circuit.

2. The apparatus according to claim 1 wherein said discriminator circuit provides a first and a second output signal in a push-pull relation, each having a fixed quiescent current $i_o$ associated therewith, said first signal being applied to the base electrode of said first transistor, said second signal being applied to the base electrode of said second transistor, said first and second transistors operating to provide cancellation of said quiescent current $i_o$ at said collector electrode connection.

3. The apparatus according to claim 1 further comprising:

a. a switch having a common terminal, and first and second associated terminals which can be selectively connected to said common terminal via a moveable arm associated with said switch, said common terminal being connected to said collector connection of said first and second transistors and said first terminal being coupled to said voltage divider, and b. a source of operating potential connected to said second terminal of said switch.

4. Control circuitry for tuning the frequency of a variable oscillator responsive to a voltage applied to a variable reactance device coupled to said oscillator, comprising:

a. discriminator circuit means having an input terminal responsive to an applied signal frequency to provide at an output terminal a control voltage of a magnitude dependent upon said frequency being different from a desired value, b. first and second transistors each having an emitter, collector and base electrode, each transistor being of opposite conductivity and connected in a series DC path, with the emitter electrode of said first transistor connected to a first point of potential, said collector electrode of said first transistor connected to said collector electrode of said second transistor and said emitter electrode of said second transistor returned to a different point of potential with respect to said first point, c. means coupled to said base electrodes for applying said control voltage thereto to provide at said collector connection a control current proportional thereto, d. an adjustable voltage divider having an output terminal connected to said variable reactance device for tuning said oscillator in accordance with the applied voltage, e. a first resistor coupled between said collector electrode connection of said transistors and a point on said divider, f. a second resistor coupled between said collector electrode connection of said transistors and a second different point on said divider, said first and second resistors serving to inject a portion of said control current into said divider so that said dependency of said control voltage magnitude upon said frequency difference is substantially unaffected by the adjustment of said divider.

5. The control circuitry according to claim 4 further including:

a. a first diode connected between the base electrode and emitter electrode of said first transistor and polarized to conduct current in the same direction as said base-to-emitter junction of said first transistor, b. a second diode connected between the base electrode and emitter electrode of said second transistor and polarized to conduct current in the same direction as said base-to-emitter junction of said second transistor.

6. The control circuit according to claim 4 further including:

a. a third resistor coupled between the junction of said second resistor and said collector connection, and a point of reference potential for preventing saturation of said first transistor upon the application of said control voltage thereto.

7. A circuit for controlling the frequency of an oscillator in a heterodyne receiver by controlling the reactance of a variable reactance device coupled to the frequency determining network of said oscillator, comprising:

a. means providing a potential supply source having a pair of terminals;

b. first, second, third, fourth, and fifth resistive elements, said first, second and third resistive elements being connected in series between said pair of terminals, said fourth and said fifth resistive elements being connected in series across said second resistive element, and said second resistive element having an adjustable slider connected to said variable reactance device to change the voltage applied thereto to tune said oscillator over a predetermined frequency range;

c. automatic frequency control system responsive to deviations of said oscillator frequency from that established by said adjustable slider to produce an error signal; and d. means connecting said automatic frequency control system to the junction of said third and fourth resistive elements, the resistance values of said resistive elements proportioned to equalize the gain of said automatic frequency control system over the tuning range of said oscillator.

* * * * *